United States Patent [19]

Guzman

[11] Patent Number: 4,884,034
[45] Date of Patent: Nov. 28, 1989

[54] GROUND FAULT DETECTOR AND LOCATOR

[76] Inventor: Hermilo Guzman, 8115 W. Krall St., Glendale, Ariz. 85303

[21] Appl. No.: 292,912

[22] Filed: Jan. 3, 1989

[51] Int. Cl.$^4$ ............................................. G01R 31/08
[52] U.S. Cl. ................................... 324/529; 324/528; 340/650; 340/651
[58] Field of Search ..................... 361/45, 46; 340/650, 340/651, 652; 324/529, 559, 528, 521, 127, 508, 509

[56] References Cited

U.S. PATENT DOCUMENTS

| | | |
|---|---|---|
| 4,002,968 | 1/1977 | Reid ................................... 324/509 |
| 4,151,460 | 4/1979 | Seese et al. |
| 4,417,202 | 11/1983 | Pascoe |
| 4,556,946 | 12/1985 | Taniguti |
| 4,584,555 | 4/1986 | Domorazek |
| 4,739,274 | 4/1988 | Kimball et al. |
| 4,739,275 | 4/1988 | Kimball et al. |

FOREIGN PATENT DOCUMENTS

| | | | |
|---|---|---|---|
| 0121612 | 7/1946 | Australia ........................... 324/529 |
| 1152483 | 8/1963 | Fed. Rep. of Germany ...... 324/529 |
| 1272567 | 8/1961 | France ................................ 324/529 |
| 0208474 | 11/1984 | Japan .................................. 324/529 |
| 0100985 | 12/1962 | Norway .............................. 324/529 |
| 0114006 | 5/1945 | Sweden .............................. 324/529 |

Primary Examiner—Reinhard J. Eisenzopf
Assistant Examiner—Jose M. Solis
Attorney, Agent, or Firm—Warren F. B. Lindsley

[57] ABSTRACT

A ground fault detector and locator for use in servicing ungrounded d-c or a-c power distribution systems. A pulsating ground current is introduced between the unfaulted side of the distribution system and earth ground. A current probe and associated sensing circuits are then employed to identify the faulted branch circuit without interrupting service to unfaulted branch circuits.

9 Claims, 3 Drawing Sheets

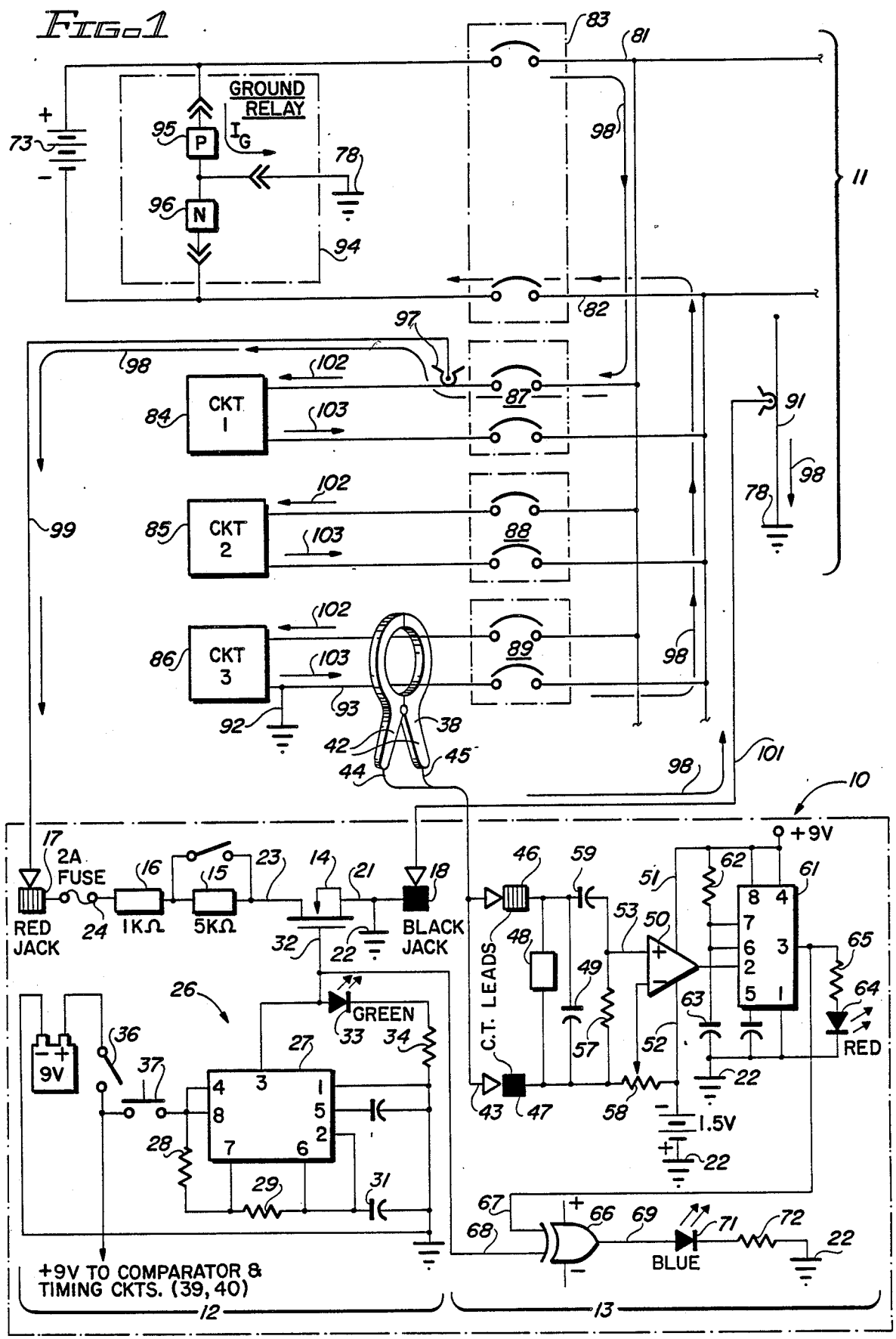

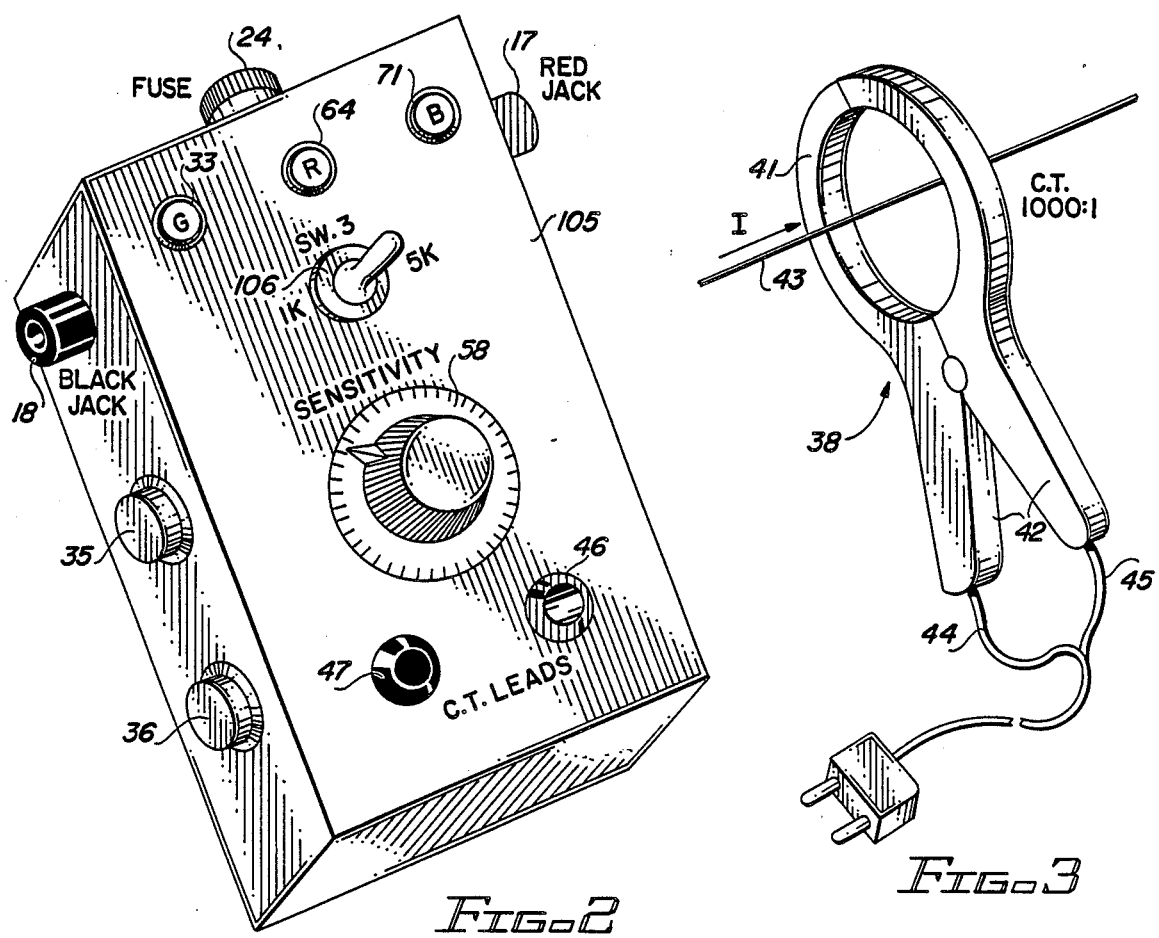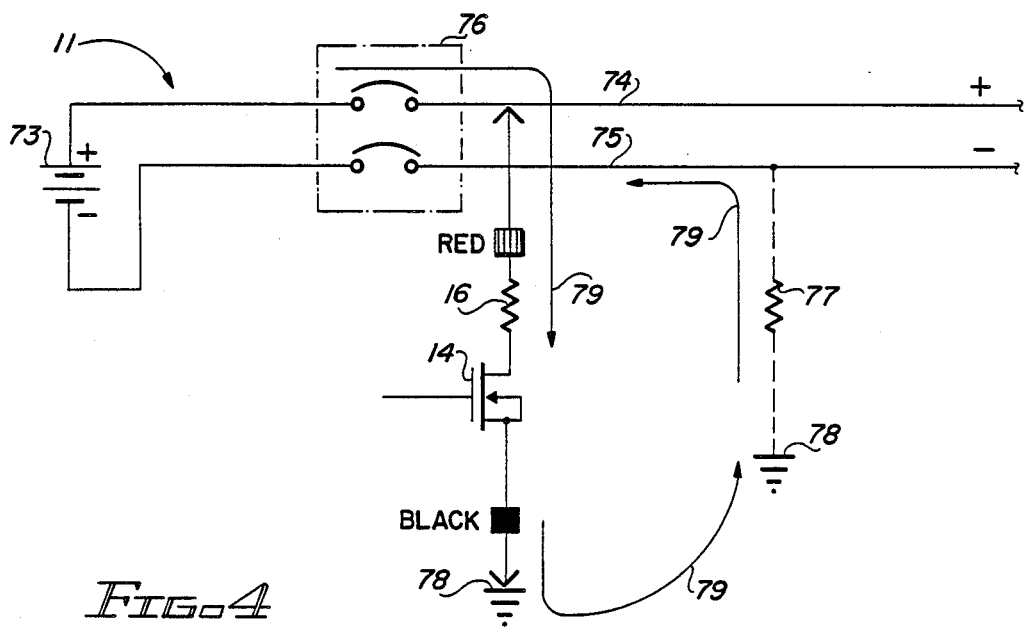

GROUND FAULT DETECTOR AND LOCATOR

BACKGROUND OF THE INVENTION

This invention relates to the identification and location of ground faults in normally ungrounded a-c or d-c power distribution systems.

Private power distribution systems are frequently ungrounded, that is, neither side of the distributed voltage is tied directly to ground. In some cases there may be an earth ground connection, but the connection may be made through a high resistance (a thousand ohms or more). The advantage of such an arrangement is that when a first ground fault occurs the fault current is either zero (in the case of no initial ground connection) or only a few milliamperes. If the first ground fault is detected and cleared before a second ground fault occurs in the other line a more serious or catastrophic fault can be prevented.

To detect the occurrence of the first fault in such systems, ground relays are typically employed. The first ground fault causes a voltage to be applied to the coil of the ground relay and the resultant operation of the relay sounds an alarm indicating the fault has occurred.

Unfortunately, the alarm gives no indication of the fault location within the distribution system. In the absence of a more sophisticated fault locator, the maintenance person must then proceed to isolate the fault by opening branch circuit breakers until the alarm is silenced, in this way determining on which branch circuit the fault is located. The disadvantage of this procedure is that several branch circuits must typically be powered down before the fault is located, with electrical service to unfaulted branches being unnecessarily interrupted.

What is needed is a convenient and effective means for locating the fault or identifying the branch circuit in which is has occurred without interrupting service to any part of the system. Once the fault has been located, only the faulted branch need be opened for repair.

DESCRIPTION OF THE PRIOR ART

In U.S. Pat. Nos. 4,739,274 and 4,739,275 (Kimball) a d-c ground fault detection device is described for the detection of ground leakage currents in a normally ungrounded d-c system. This device incorporates a ground current indicator which senses that a ground fault has occurred and responds by activating a pulser. The pulser periodically interrupts the fault current by opening and closing a reed relay. The resultant interrupted fault current is sensed by a magnetic sensor such as a Hall effect device. The Hall effect sensors and associated amplification and indicator circuits are permanently installed in each of the branch circuits so that the branch circuit may be automatically identified. The present invention is directed toward application in distribution systems where cost considerations preclude the use of such fully automatic fault location apparatus.

U.S. Pat. No. 4,556,946 (Taniguti) describes a ground detection arrangement for an a-c generator in which positive and negative d-c voltages are alternately applied to the neutral point of an armature winding so as to detect voltages proportional to ground currents corresponding to the d-c voltages. The device enables the determination of ground resistance regardless of the grounding position within the alternator.

U. S. Pat. No. 4,151,460 (Seese) describes a ground fault detection system for an ungrounded polyphase a-c distribution system. In this device a pulsing system utilizes a relay to periodically alter the grounding resistance between neutral and earth ground. The resultant periodic variation in ground current is detected along the faulted line by means of a magnetic sensor. A disadvantage of this approach (and of the Kimball device as well) is that the fault current is interrupted or modulated by means of a relay. The relay operation inherently introduces electrical noise which may interfere with the operation of the device.

U.S. Pat. No. 4,417,202 (Pascoe) describes a ground fault detector apparatus for a d-c source in which the positive and negative lines are alternately grounded by means of switching transistors. The resulting fault currents are compared with a reference current. When the reference current is exceeded a ground fault is indicated.

SUMMARY OF THE INVENTION

In accordance with the invention claimed an improved ground fault detection device is provided for use in locating a ground fault in an ungrounded d-c or a-c power distribution system.

It is therefore an object of the present invention to provide an improved ground fault locating device for use in servicing ungrounded d-c and a-c distribution systems.

Another object of the invention is to provide such a ground fault detection device in portable hand-held form, operable by one person.

A further object of the invention is to provide such a fault detection device in a form that requires no interference with or modification of the existing distribution system in connection with the use of the device.

A still further object of the invention is to provide in such a fault detection device a capability for locating ground faults without interrupting service to unfaulted branch circuits.

A still further object of the invention is to provide such a device in a highly reliable form not emploing mechanical components such as relays which are subject to early failure and which inherently produce electrical noise that may interfere with the reliable operation of the device.

A still further object of the invention is to provide such a fault detection device in a form not requiring an external power source, being operable from a compact self-contained battery.

A still further object of the invention is to provide as a part of such a fault detection device a magnetic sensing circuit that is insensitive to polarity in terms of the direction in which the fault current flows through the yoke of the clamp-on current transformer that is employed as a sensing device.

A still further object of the invention is to provide such a ground fault detection device that is effective in isolating ground faults in a-c as well as d-c distribution systems.

Further objects and advantages of the invention will become apparent as the following description proceeds and the features of novelty which characterize the invention will be pointed out with particularity in the claims annexed to and forming a part of this specification.

BRIEF DESCRIPTION OF THE DRAWINGS

The present invention may be more readily described with reference to the accompanying drawings, in which:

FIG. 1 is a schematic drawing illustrating the circuits and components comprising the ground fault detection device and its use in the isolation of a ground fault in an ungrounded d-c distribution system;

FIG. 2 is a perspective view of a hand held instrument incorporating the fault detection circuit of the invention;

FIG. 3 is a perspective view of a conventional clamp-on current probe that is employed as the sensing element of the invention;

FIG. 4 is a simplified schematic showing the current path for a ground fault current with the fault detection device connected;

DESCRIPTION OF THE PREFERRED EMBODIMENT

Figure 5:
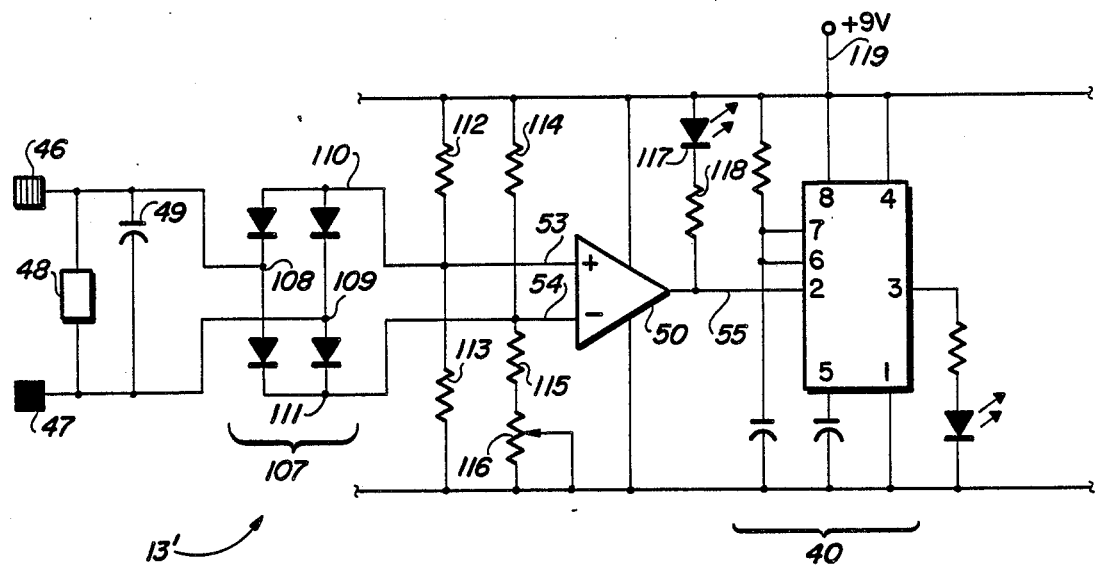
FIG. 5 is a schematic diagram showing a second embodiment of the sensing circuit employed in the fault detection device of the invention, the second embodiment thereof rendering the sensing circuit insensitive to the polarity of the fault current as it passes through the yoke of the clamp-on current probe.

Referring more particularly to the drawings by characters of reference, FIG. 1 discloses a first embodiment of the ground fault detection and location device 10 of the invention, the device 10 shown in use for the isolation of a ground fault in an ungrounded d-c power distribution system 11.

The device 10 comprises two major elements, namely, a pulsed grounding circuit 12 and a sensing circuit 13. The function of the pulsed grounding circuit 12 is to add a second ground fault to the distribution system in a pulsating fashion such that a pulsating ground current is produced in the original ground fault path, the a-c component of the ground current created thereby being essential to the sensing capability of the sensing circut 13.

Pulsed grounding circuit 12 comprises a power MOSFET 14 (metal oxide field effect transistor) serially connected with resistors 15 and 16 between two probe receptacle jacks 17 and 18, jack 17 being shown as a red jack for connection to a negative potential. The MOSFET has its source terminal 21 connected to jack 18 and to the common terminal 22 of device 10. Its drain terminal 23 is connected via resistors 15 and 16 and a series fuse 24 to jack 17.

MOSFET 14 is pulsed "on" and "off" by a multivibrator circuit 26 comprising a 555 timer 27. The 555 timer 27 is a commercially available integrated circuit intended for use either as a "one-shot" or as a multivibrator. (For a description of the 555 timer, see, for example, pp. 6-49 through 6-55 of the Signetics data book entitled "SIGNETICS DIGITAL LINEAL MOS," copyright 1972 —Signetics, 811 E. Arques Avenue, Sunnyvale, California 94086.) In the connection of the 555 timer shown in circuit 26 of grounding circuit 12, timer 27 is connected to operate as a free-running multivibrator (with trigger terminal 2 connected to terminal 6). Resistors 28 and 29 and capacitor 31 determine the durations of the "on" and "off" periods of the multivibrator. During the "on" period a positive voltage is delivered at the output terminal (terminal 3) of the 555 timer 27. The positive signal at terminal 3 is connected to the gate 32 of MOSFET 14 to turn the MOSFET on; it also energizes a green light-emitting diode 33 which is serially connected with a current-limiting resistor 34 between terminal 3 and common terminal 22. Ground terminal 1 of timer 27 is connected to common terminal 22, and supply terminal 8 is connected via switches 35 and 36 to the positive terminal of a 9 volt battery 37. The negative terminal of battery 37 is connected to common terminal 22 of device 10. Switch 36 is a single-pole, double-throw switch that is employed to de-energize device 10, removing voltage from sensing circuit 13 when device 10 is not in use. Switch 35 is a momentary switch that is pressed during the use of device 10. This switching arrangement reduces power consumption to a minimum, thereby prolonging the life of battery 37.

Sensing circuit 13 comprises a clamp-on current probe 38, a comparator circuit 39 and a timer circuit 40.

Current probe 38 (FIGS. 1 & 3) is a commonly available a-c current probe. It has a hinged magnetic yoke or core 41 that is held closed by a spring and may be opened by squeezing the handles 42 to slip the yoke over the conductor or conductors 43 carrying the current that is to be sensed. The conductor(s) passing through the center of the yoke constitute(s) a single primary turn of a transformer. A large number of secondary turns wound about the yoke form a secondary winding, the terminations of which are brought out as leads 44 and 45. The leads 44 and 45 are connected to comparator circuit input terminals 46 and 47 respectively, of sensing circuit 13. A voltage limiting device 48 is connected across terminals 46 and 47 to protect comparator circuit 39 against excessive voltage that may be supplied by probe 38 under certain circumstances. A suitable voltage limiting device for this purpose is a diac (readily available from various sources), which functionally resembles a pair of zener diodes connected back-to-back. Also connected across terminals 46 and 47 is a filter capacitor 49 which is provided for the purpose of filtering out noise.

Comparator 39 comprises any of a wide variety of commercially available comparators or operational amplifiers in integrated circuit form. The basic comparator 50 as shown in FIG. 1 has a supply terminal 51, a ground terminal 52, a non-inverting input terminal 54, and an output terminal 55. When the non-inverting input terminal 53 is more positive than the inverting input terminal 54 the signal at the output terminal 55 is high (nearly equal to supply voltage). When the inverting input terminal is positive with respect to the non-inverting input terminal the output voltage is low (near zero volts). A suitable comparator for this purpose is an LM111 which is available from National Semiconductor Corporation, 2900 Semiconductor Drive, Santa Clara, California 95051 (see National's Linear Data Book of 1982, pages 5-16 through 5-21). In the comparator circuit 39 of device 10, comparator 50 has its supply terminal 51 connected to +9 volts supplied by switch 36 from battery 37. Its ground terminal is connected to the negative terminal of a 1.5 volt battery 56 which has its positive terminal connected to common terminal 22. Its non-inverting input terminal 53 is connected through a resistor 57 to common terminal 22 and its inverting input terminal 54 is connected to the pick-off terminal of a potentiometer 58 that has its end terminations connected between common terminal 22 and the negative terminal of battery 56. The voltage at inverting input terminal 54 is thus adjustable between zero (common reference) and −1.5 volts while the non-inverting input terminal 53, in the absence of an input signal from probe 38 is at zero volts. Under these conditions the output terminal 55 is high (near 9 volts). If comparator 50 has an open collector output a pull-up resistor will be required from output terminal 55 to +9 volts. The non-inverting input terminal is also connected by a coupling capacitor 59 to comparator circuit input terminal 46. When a negative signal is supplied by probe 38 at terminal 46 and coupled to terminal 53 of caparator 50 it causes terminal 53 to be driven negative with respect to terminal 54 and output terminal 55 switches to the low state (in this case to nearly −1.5 volts).

Timer circuit 40 comprises a 555 timer 61 (same as timer 27) connected, in this case, for operation as a one-shot wherein a negative edge at input terminal 2 initiates a positive pulse at output terminal 3. The duration of the output pulse is determined by timing resistor 62 (connected from supply terminal 8 to threshhold terminal 6) and timing capacitor 63 (connected from terminal 6 to common or ground terminal 1). In this case resistor 62 and capacitor 63 are chosen to produce an output pulse of a duration matching the duration of the positive output pulse of timer 27. A red LED 64 (light-emitting diode) is serially connected with a current-limiting resistor 65 between output terminal 3 of timer 61 and common terminal 22. LED 64 is energized when timer 61 output voltage is high.

An exclusive NOR gate 66 has one input terminal 67 connected to output terminal 3 of timer 61 and its other input terminal 68 connected to output terminal 3 of timer 27. The output terminal 69 of gate 66 drives a blue LED 71 and series limiting resistor 72. When both input terminals are high or when both input terminals are low, output terminal 69 is high.

Prior to a discussion of the operation of device 10 it will be helpful first to review the response of the distribution system 11 to ground fault conditions. With reference first to the simplified representation of FIG. 4, the system 11 comprises a d-c source shown as a battery 73 connected to positive and negative branch circuit lines, 74 and 75, respectively, by a two-pole circuit breaker 76. A fault to ground is represented by a phantom resistor 77 connected between negative line 75 and earth ground 78. With no other circuits or connections made between system 11 and earth ground 78 there is no current flow through resistor 77 because there is no return path.

Now assume that a power MOSFET transistor (transistor 14 of device 10) and series limiting resistor 16 are connected from positive line 74 to earth ground 78 as shown in FIG. 4. The full supply voltage (voltage supplied by battery 73) is now impressed across the series circuit comprising resistor 16, transistor 14, earth ground and resistor 77. If transistor 14 is turned on by a positive gate signal a current 79 will flow from the positive battery terminal to line 74, through resistor 16 and transistor 14 to earth ground 78 and returning from ground 78 through resistor 77 and line 75 to the negative battery terminal. When transistor 14 is turned off, the negative battery terminal is held at ground potential by phantom resistor 77 and positive line 74 if positive with respect to earth by a voltage equal to battery voltage; when transistor 14 is turned on the line potentials relative to earth are determined by the relative resistance values of resistors 16 and 77. When transistor 14 is pulsed "on" and "off" the current 79 is a pulsed current alternately taking a value of zero and the value determined by battery voltage and the two resistors 16 and 77.

Referring now to FIG. 1, the source is again represented by a battery 73, its positive and negative terminals connected to positive and negative mains 81 and 82, respectively, by a main circuit breaker 83. First, second and third branch circuits 84, 85 and 86, respectively, are connected from mains 81 and 82 by branch circuit breakers 87, 88 and 89. An earth ground rod 91, initially with no connection to system 11, is shown driven into earth ground 78.

If a ground fault 92 now occurs between negative line 93 of branch circuit 86 and earth ground 78, negative line 93 and negative main 82 are both brought to ground potential. A ground fault relay 94 installed as shown between mains 81 and 82 and earth ground 78 detects the voltage inbalance across its "P" and "N" relays, 95 and 96 when the fault 92 causes the positive main 81 to rise to the full battery voltage above earth ground with the result that the full battery voltage now appears across "P" relay 95.

At this point the ground fault relay sets off an alarm an the service person is called in to locate and correct the ground fault.

The service person first removes the ground fault relay to interrupt the path it provides to earth ground. A voltmeter reading between positive main 81 and earth ground 78 quickly verifies that the ground fault is between a negative line and ground. The problem that remains is to determine in which branch circuit the fault has occurred. At this point the device 10 is called into service.

Recognizing that the positive main 81 and all connected positive lines of the branch circuits are at positive potentials with respect to earth ground, the service person connects positive terminal 17 to a positive line at point 97. Negative terminal 18 of device 10 is connected to ground rod 91. When transistor 14 is turned on a current 98 flows from positive bus 81, through the positive pole of breaker 87 through positive test lead 99 of device 10 into device 10 terminal 17, through resistors 16 and 15 and transistor 14 to terminal 18 and thence through negative test lead 101 to ground rod 91 and earth ground. From earth ground the current 98 flows through the fault 92 to the negative branch line, through the negative pole of branch circuit breaker 89 to negative main 82.

The current probe 38 is now clamped over the positive and negative lines of each of the branch circuits in succession. It will be noted that in the case of branch circuits 84 and 85, load currents 102 and 103 flowing in the positive and negative lines, respectively, are opposite in direction and equal in magnitude. If probe 38 is clamped over such a balanced pair of branch conductors in which no fault has occurred the currents in the two lines cancel each other and no voltage is induced in the probe. In the positive and negative lines of branch circuit 86 the load currents 102 and 103 also cancel each other when both of these lines are sensed by probe 38, but in the presence of the fault 92 the pulsating current 98 produced when transistor 14 is pulsed on and off by pulsing circuit 12 induces a voltage in probe 38. Assuming probe 38 has been appropriately directed or polarized as it is clamped over the branch circuit wires (the service person may have to check both directions) a negative voltage will be delivered to non-inverting input terminal 53 of comparator 50. If this negative voltage is more negative than the voltage at inverting input terminal 54 the output voltage of comparator 50 at terminal 55 will fall, thereby initiating a positive pulse at the output of timer circuit 40 during which red LED 64 is energized. Green LED 33 connected at the gate of transistor 14 is simultaneously energized, the red and green LED's 64 and 33 turning on and off in synchronism with the turning on and off of transistor 14.

The incorporation of the exclusive NOR gate 66 is a safeguard against unrecognized erratic operation of the device 10. If noise signals should cause the red light to flicker on and off the service person might incorrectly assume that the faulted line has been located. Unless the red and green LED's are energized in synchronism, however, a flashing red light is not a true indication of a faulted line. When the blue LED is connected as shown by means of gate 66 it is energized as described earlier when both inputs of gate 66 are high or low. Thus, if both the red and green LED's are energized synchronously, both inputs of gate 66 will be simultaneously high and low and the blue LED will glow steadily, verifying that the faulted line has indeed been located.

FIGS. 2 and 3 illustrate a practical implementation of the invention in the form of a compact hand-held instrument 105 that incorporates the circuits of device 10 and provide terminals for the connection of probe 38 and test leads 99 and 101. Also shown in FIG. 2 are the three LED's 33, 64 and 71 (green, red and blue, respectively) switches 35 and 36, sensitivity control (potentiometer 58) and a third switch 106 (switch 106 shorts out resistor 15 which reduces the resistance in series with transistor 14 for use of the device 10 in low voltage systems).

The invention as just described in its first embodiment has thus been shown to provide a rapid and convenient means for locating a ground fault in an ungrouded d-c system. Once the faulted branch circuit has been identified it can be isolated by means of the associated branch circuit breaker and the fault can be corrected without interrupting service to the other branch circuits.

One limitation of the invention in its first embodiment of the invention has been noted. The probe 38 must be properly oriented relative to the direction of the fault current in order that the signal produced at the input of the comparator will be of the correct polarity. This may necessitate experimentation (clamping in both directions) at each test point. In addition, care must be taken to assure the correct polarity in the connection of test leads 99 and 101. Both of these limitations are corrected in a second embodiment of the invention as shown in FIGS. 5 and 6.

Figure 6:
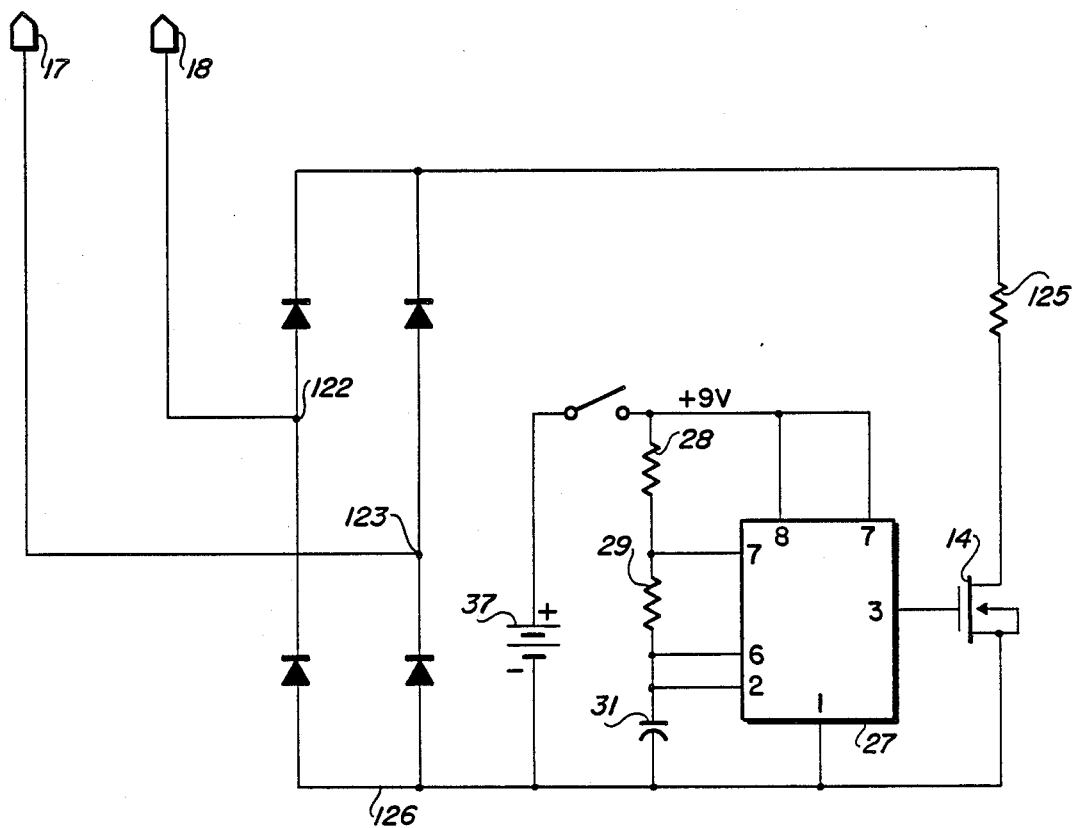
FIG. 6 is a simplified schematic showing a second embodiment of the pulsed grounding circuit which is a second portion of the fault detection circuit of the invention, this second embodiment of the invention being capable of use on a-c as well as d-c distribution systems.

FIG. 5 shows a second embodiment of the sensing circuit 13. In the improved sensing circuit 13' of FIG. 5 a rectifier bridge 107 is incorporated between the current probe that is connected at the input terminals 46 and 47. The terminals 46 and 47 are connected to the a-c terminals 108 and 109, respectivly, of bridge 107. The negative terminal 110 is connected to the non-inverting input terminal 53 of comparator 50 and the positive terminal 111 of the bridge is connected to the inverting input terminal 54 of the comparator. With this connection the probe may be clamped in either direction and either polarity at terminals 46 and 47 is acceptable because a signal of either polarity at terminal 46 and 47 produces a negative signal at non-inverting input terminal 53.

In circuit 13' the 1.5 volt battery has also been eliminated through the use of two resistance dividers. The first resistance divider comprising resistors 112 and 113 set the d-c bias level of input terminal 53 at approximately 4.5 volts (at the center of the 9 volt supply voltage range). The second divider comprising resistors 114, 115 and adjustable resistor 116 bias terminal 54 at a potential that is negative by a desired degree relative to terminal 53. Variable resistor 116 is the sensitivity adjustment.

A further alternative is the elimination of the timing circuit 40. By virtue of the direct connection of the probe 38 to the comparator input terminals (rather than through a coupling capacitor), the comparator output will be low throughout the duration of the current pulse. The red LED 117 can thus be connected in series with a limiting resistor 118 between the +9 volt terminal 119 and the comparator output 55. An inverter circuit (not shown) must be incorporated in this case between the output of comparator 50 and the input 67 of the exclusive NOR gate 66 if the NOR gate and its function are to be retained. A further alternative is to remove the need for the inverter by reversing the input connections of the caparator so that its output is driven positive by a detected fault current.

FIG. 6 shows a second embodiment of the pulsing circuit 12 of device 10. In the pulsing circuit 12' of FIG. 6 a rectifier bridge 121 has been incorporated. Input terminals 17 and 18 (corresponding to input terminals 17 and 18 of the original pulsing circuit 12) are connected to the a-c terminals 122 and 123 of bridge 121. The positive terminal 124 of the bridge is connected through a limiting resistor 125 to the drain of transistor 14 and the source terminal of transistor 14 is connected to the negative terminal 126 of the bridge. Regardless of the polarity of the voltage at terminals 17 and 18 the correct polarity is always obtained at transistor 14, and the service person need no longer be concerned about the polarity when connecting the test leads.

The embodiments of FIGS. 5 and 6 also render the device 10 operable in a-c as well as d-c systems by virtue of the rectification provided by bridge rectifiers 107 and 121.

An improved ground fault detection and location device is thus provided in accordance with the stated objects of the invention, and although but two embodiments of the invention have been illustrated and described, it will be apparent to those skilled in the art that various changes and modifications may be made therin without departing from the spirit of the invention or from the scope of the appended claims.

What is claimed is:

1. An apparatus for the detection of ground faults in a normally ungrounded a-c or d-c multifeeder power distribution system comprising:
   a d-c power supply,
   a pulse grounding circuit connected across said power supply,
   said pulse grounding circuit comprising transistor means connected across a pair of probe receptacle jacks and a multivibrator means for pulsing said transistor means,
   said jacks being connectable across the distribution system for adding a ground fault to the distribution system being checked for ground faults in a pulsating fashion, whereby the added ground fault in a grounded conduit of the distribution system will create an a-c component of the ground current created thereby for sensing by a sensing circuit, a sensing circuit comprising a clamp-on current probe, said probe comprising a yoke for surrounding said grounded conduit of the distribution system which conduit serves as a single primary turn of a transformer, said yoke being wound with a number of turns of a wire forming a secondary winding of the transformer the terminals forming the ends of said wire being connected across a comparator circuit, and a comparator circuit for receiving signals from said probe, said comparator circuit when receiving a negative voltage of a predetermined value generating a positive pulse for energizing a first light emitting diode indicating a ground fault on the conduit surrounded by said yoke.

2. The apparatus set forth in claim 1 in further combination with:

a second light emitting diode connected between said transistor means and ground, whereby said first diode and said second diode pulse in synchronism with the pulsing of said transistor 3. The apparatus set forth in claim 2 wherein:

said first diode glows red and said second diode glows green when energized.

4. The apparatus set forth in claim 2 in further combination with:

a NOR gate connected between the output of said transistor means and the output of said comparator, and a third light emitting diode connected to the output of said NOR gate, said third diode being energized when the output signals of said transistor means and said comparator are simultaneously high or low.

5. The apparatus set forth in claim 4 wherein:

said third diode glows blue when energized.

6. The apparatus set forth in claim 1 wherein:

said comparator circuit comprises an operational amplifier in integrated circuit form.

7. The apparatus set forth in claim 1 in further combination with:

a hand holdable housing for containing said power supply, pulse grounding circuit and sensing circuit exclusive of said probe, said probe being connectable to said jacks, and said jacks forming outlet terminals on the outer periphery of said housing.

8. The apparatus set forth in claim 1 wherein:

said sensing circuit comprises a rectifier bridge for providing a negative voltage to said comparator circuit regardless of the plurality of the signal received from said probe.

9. The apparatus set forth in claim 1 wherein:

said pulse grounding circuit comprises a rectifier bridge connected across said jacks, and said transistor means is connected across said rectifier bridge, whereby regardless of the polarity of the voltage at said jack a given polarity is always obtained at said transistor means.

* * * * *

UNITED STATES PATENT OFFICE
CERTIFICATE OF CORRECTION

Patent No. 4,884,034　　　　　　　　Dated NOvember 28, 1989

Inventor(s) Hermilo Guzman

It is certified that error appears in the above-identified patent and that said Letters Patent is hereby corrected as shown below:

Claim 2, line 6, after "transistor" add ---means---.

Signed and Sealed this

Sixth Day of November, 1990

*Attest:*

HARRY F. MANBECK, JR.

*Attesting Officer*　　　　*Commissioner of Patents and Trademarks*